(12) United States Patent
Sakai et al.

(10) Patent No.: US 10,384,227 B2
(45) Date of Patent: Aug. 20, 2019

(54) FLUID DISCHARGING APPARATUS AND METHOD OF DISCHARGING FLUID

(71) Applicant: Seiko Epson Corporation, Tokyo (JP)

(72) Inventors: Hirofumi Sakai, Shiojiri (JP); Takahiro Katakura, Okaya (JP); Keigo Sugai, Chino (JP); Junichi Sano, Chino (JP); Shinichi Nakamura, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/707,231

(22) Filed: Sep. 18, 2017

(65) Prior Publication Data

US 2018/0085773 A1 Mar. 29, 2018

(30) Foreign Application Priority Data

Sep. 29, 2016 (JP) ................................ 2016-190760

(51) Int. Cl.
*B05C 5/02* (2006.01)
*B33Y 30/00* (2015.01)
(Continued)

(52) U.S. Cl.
CPC ........ *B05C 5/0225* (2013.01); *B05C 11/1034* (2013.01); *B29C 64/209* (2017.08);
(Continued)

(58) Field of Classification Search
CPC ....... B05C 5/0225; B33Y 30/00; B33Y 50/02; B29C 64/209; B29C 64/393;
(Continued)

(56) References Cited

U.S. PATENT DOCUMENTS 5,356,034 A * 10/1994 Schlumberger ............ B01J 4/02
222/462
6,060,125 A * 5/2000 Fujii ..................... B05C 5/0225
222/518
(Continued)

FOREIGN PATENT DOCUMENTS

EP 2 808 093 A1 12/2014
EP 2 842 753 A1 3/2015
(Continued)

OTHER PUBLICATIONS

Partial European Search Report for Patent Application No. EP17193496.1 dated Feb. 12, 2018 (15 pages).
(Continued)

*Primary Examiner* — Steven J Ganey
(74) *Attorney, Agent, or Firm* — Harness, Dickey & Pierce, P.L.C.

(57) ABSTRACT

A fluid discharging apparatus includes an accommodation unit that accommodates a fluid, a discharge port that communicates with the accommodation unit, a moving object that moves in a first direction toward the discharge port and in a second direction away from the discharge port in the accommodation unit, and a control unit that controls driving of the moving object. The control unit performs discharging processing and moving processing. In the discharging processing, the discharge port is opened by moving the moving object from a closed position at which the discharge port is closed, in the second direction, and then the fluid is extruded and discharged from the discharge port by moving the moving object in the first direction. In the moving processing, the moving object is moved in the second direction during a period when the fluid is discharged from the discharge port in the discharging processing.

10 Claims, 8 Drawing Sheets

(51) Int. Cl.
    *B33Y 50/02* (2015.01)
    *B29C 64/209* (2017.01)
    *B29C 64/393* (2017.01)
    *B41J 2/045* (2006.01)
    *B41J 2/165* (2006.01)
    *B41J 2/21* (2006.01)
    *B41J 2/14* (2006.01)
    *B05C 11/10* (2006.01)
    *H05K 3/12* (2006.01)

(52) U.S. Cl.
    CPC ............ *B29C 64/393* (2017.08); *B33Y 30/00* (2014.12); *B33Y 50/02* (2014.12); *B41J 2/0459* (2013.01); *B41J 2/04561* (2013.01); *B41J 2/04588* (2013.01); *B41J 2/14* (2013.01); *B41J 2/16579* (2013.01); *B41J 2/2142* (2013.01); *B41J 2/14048* (2013.01); *B41J 2202/05* (2013.01); *H05K 3/1241* (2013.01)

(58) Field of Classification Search
    CPC .. B41J 2/04561; B41J 2/04588; B41J 2/0459; B41J 2/16579; B41J 2/2142; H05K 3/1241
    USPC ............... 239/1, 69, 102.1, 102.2, 583, 584; 222/462, 518
    See application file for complete search history.

(56) References Cited

U.S. PATENT DOCUMENTS

| | | | |
|---|---|---|---|
| 6,082,629 | A | 7/2000 | Lee et al. |
| 6,391,111 | B1 | 5/2002 | Fujimoto et al. |
| 6,527,142 | B1 | 3/2003 | Ikushima |
| 7,134,617 | B2 | 11/2006 | Ikushima |
| 7,150,519 | B2 | 12/2006 | Kono et al. |
| 9,260,234 | B2 | 2/2016 | Ikushima |
| 9,440,781 | B2 | 9/2016 | Ikushima |
| 9,441,617 | B2 | 9/2016 | Kazumasa |
| 2003/0132243 | A1 | 7/2003 | Engel |
| 2004/0050974 | A1 | 3/2004 | Lee et al. |
| 2004/0118865 | A1 | 6/2004 | Maruyama et al. |
| 2004/0134996 | A1 | 7/2004 | Kazumasa |
| 2009/0071974 | A1 | 3/2009 | Ikushima |
| 2009/0167818 | A1 | 7/2009 | Morita |
| 2010/0194803 | A1 | 8/2010 | Ozawa |
| 2011/0045167 | A1 | 2/2011 | Ikushima |
| 2014/0217127 | A1 | 8/2014 | Ikushima |
| 2014/0346253 | A1 | 11/2014 | Ikushima |
| 2016/0031030 | A1 | 2/2016 | Bergstrom et al. |
| 2016/0107188 | A1 | 4/2016 | Ikushima |

FOREIGN PATENT DOCUMENTS

| | | |
|---|---|---|
| JP | 10-227367 A | 8/1998 |
| JP | 2002-102768 A | 4/2002 |
| JP | 2002-282740 A | 10/2002 |
| JP | 2011-031181 A | 2/2011 |
| JP | 4663894 B2 | 4/2011 |
| JP | 4711328 B2 | 6/2011 |
| JP | 5806868 B2 | 11/2015 |

OTHER PUBLICATIONS

Extended European Search Report for Application No. EP 17 19 3485 dated Feb. 7, 2018 (8 pages).

\* cited by examiner

PROCESS 1

PROCESS 2

PROCESS 3

PROCESS 4

FLUID DISCHARGING APPARATUS AND METHOD OF DISCHARGING FLUID

BACKGROUND

1. Technical Field

The present invention relates to a fluid discharging apparatus and a method of discharging a fluid.

2. Related Art

Various fluid discharging apparatuses that discharge a fluid from a discharge port are proposed. For example, JP-A-2002-282740 discloses a liquid droplet discharging apparatus in which a plunger rod is caused to perform reciprocation in a liquid chamber as an accommodation unit, and thus a liquid is discharged in a form of droplets by extruding the liquid from a discharge port. A discharging mechanism of a fluid, which uses a moving object such a plunger rod in JP-A-2002-282740 may be applied to, for example, an ink jet printer that produces a printout by discharging an ink, or a 3D printer that models a three-dimensional object by discharging a liquid material.

In the above-described fluid discharging apparatus, a situation in which, after a fluid is discharged, the next fluid is hindered from being discharged by the fluid which has adhered to a circumference of a discharge port may occur. In the fluid discharging apparatus, a technique of suppressing a fluid from remaining on the circumference of the discharge port after the fluid is discharged may be improved more.

SUMMARY

The invention can be realized as the following aspects.

(1) According to a first aspect of the invention, there is provided a fluid discharging apparatus. The fluid discharging apparatus includes an accommodation unit, a discharge port, a moving object, and a control unit. The accommodation unit accommodates a fluid. The discharge port communicates with the accommodation unit and discharges the fluid. The moving object moves in a first direction toward the discharge port and a second direction away from the discharge port in the accommodation unit. The control unit controls driving of the moving object. The control unit performs discharging processing in which the discharge port is opened by moving the moving object from a closed position at which the discharge port is closed, in the second direction, and then the fluid is extruded and discharged from the discharge port by moving the moving object in the first direction. The control unit performs moving processing in which the moving object is moved in the second direction for a period when the fluid is discharged from the discharge port by the discharging processing.

According to the fluid discharging apparatus in this aspect, the moving object is moved in a direction away from the discharge port during a period when the fluid is discharged from the discharge port, and thus a force which acts in a direction in which the fluid is drawn back from the discharge port into the accommodation unit can be generated. With the generated force, it is possible to separate a fluid droplet which is required to be scattered toward a target from a fluid which has been extruded from the discharge port, and to bring the remaining fluid back into the accommodation unit. Thus, an occurrence of a situation in which a redundant fluid is provided is at a circumferential portion of the discharge port after the fluid is discharged is effectively suppressed.

(2) In the fluid discharging apparatus of this aspect, the control unit may move the moving object in the first direction so as to reach the closed position in the discharging processing.

According to the fluid discharging apparatus in this aspect, it is possible to increase a force which is generated after the discharging processing and acts in a direction in which the fluid is drawn back from the discharge port into the accommodation unit. Accordingly, an occurrence of a situation in which a redundant fluid is provided is at the circumferential portion of the discharge port is further suppressed.

(3) In the fluid discharging apparatus of this aspect, a distance when the moving object moves in the second direction in the moving processing may be equal to or smaller than a distance when the moving object moves in the second direction in the discharging processing.

According to the fluid discharging apparatus in this aspect, an occurrence of a situation in which the moving object is excessively moved is suppressed.

(4) In the fluid discharging apparatus of this aspect, the control unit may move the moving object in the second direction in the moving processing, and then bring the moving object back to the closed position at a speed which is slower than a moving speed when the control unit moves the moving object in the first direction in the discharging processing.

According to the fluid discharging apparatus in this aspect, an occurrence of a situation in which a redundant fluid is extruded outwardly from the discharge port when the discharge port is closed in the moving processing is suppressed.

(5) In the fluid discharging apparatus of this aspect, in the moving processing, the control unit may change a speed of the moving object from a first speed to a second speed slower than the first speed, during a period when the control unit moves the moving object in the second direction.

According to the fluid discharging apparatus in this aspect, it is possible to suppress an occurrence of a situation in which an outside air is entered into the accommodation unit through the discharge port in the moving processing.

(6) The fluid discharging apparatus of this aspect may further include a fluid detection unit that detects the fluid adhering to a circumferential region of the discharge port on the outside of the accommodation unit. The control unit may change at least one of a distance and a speed when the moving object moves in the second direction in the moving processing, in accordance with the amount of the fluid detected by the fluid detection unit.

According to the fluid discharging apparatus in this aspect, it is possible to adequately adjust a processing condition of the moving processing in accordance with the amount of the fluid remaining in the circumferential region of the discharge port, and to further suppress the remaining of the fluid in the circumference of the discharge port.

(7) According to a second aspect of the invention, there is provided a method of discharging a fluid from a discharge port which communicates with an accommodation unit that accommodates the fluid. The method includes opening the discharge port by moving a moving object from a closed position at which the discharge port is closed, in a second direction away from the discharge port, and then extruding and discharging the fluid from the discharge port by moving the moving object in a first direction toward the discharge port, in the accommodation unit, and moving the moving object in the second direction during a period when the fluid is discharged from the discharge port in the discharging.

According to the method, an occurrence of a situation in which a redundant fluid is provided is in the circumference of the discharge port after the fluid is discharged is effectively suppressed.

All of a plurality of components provided in the above-described aspect of the invention are not necessary. In order to solve some or all of the above-described problems or to achieve some or all of effects described in this specification, appropriately, some of the plurality of components can be changed, removed, or replaced with other new components. In addition, some of limitation details for the components can be deleted. In order to solve some or all of the above-described problems or to achieve some or all of effects described in this specification, some or all of technical features provided in the above-described one aspect of the invention can be combined with some or all of technical features provided in the above-described another aspect of the invention, and the obtained combination can be used as a separate aspect of the invention.

The invention can be realized as various forms other than the fluid discharging apparatus and the method of discharging a fluid. For example, the invention can be realized as a printing device or a three-dimensional modeling device which includes the function of the fluid discharging apparatus, or a system which includes a function equivalent to that of the device, a control method of controlling the device, a computer program for executing a method of discharging a fluid or the above control method, a non-volatile recording medium in which the above computer program is recorded, and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

A. First Exemplary Embodiment

Figure 1:
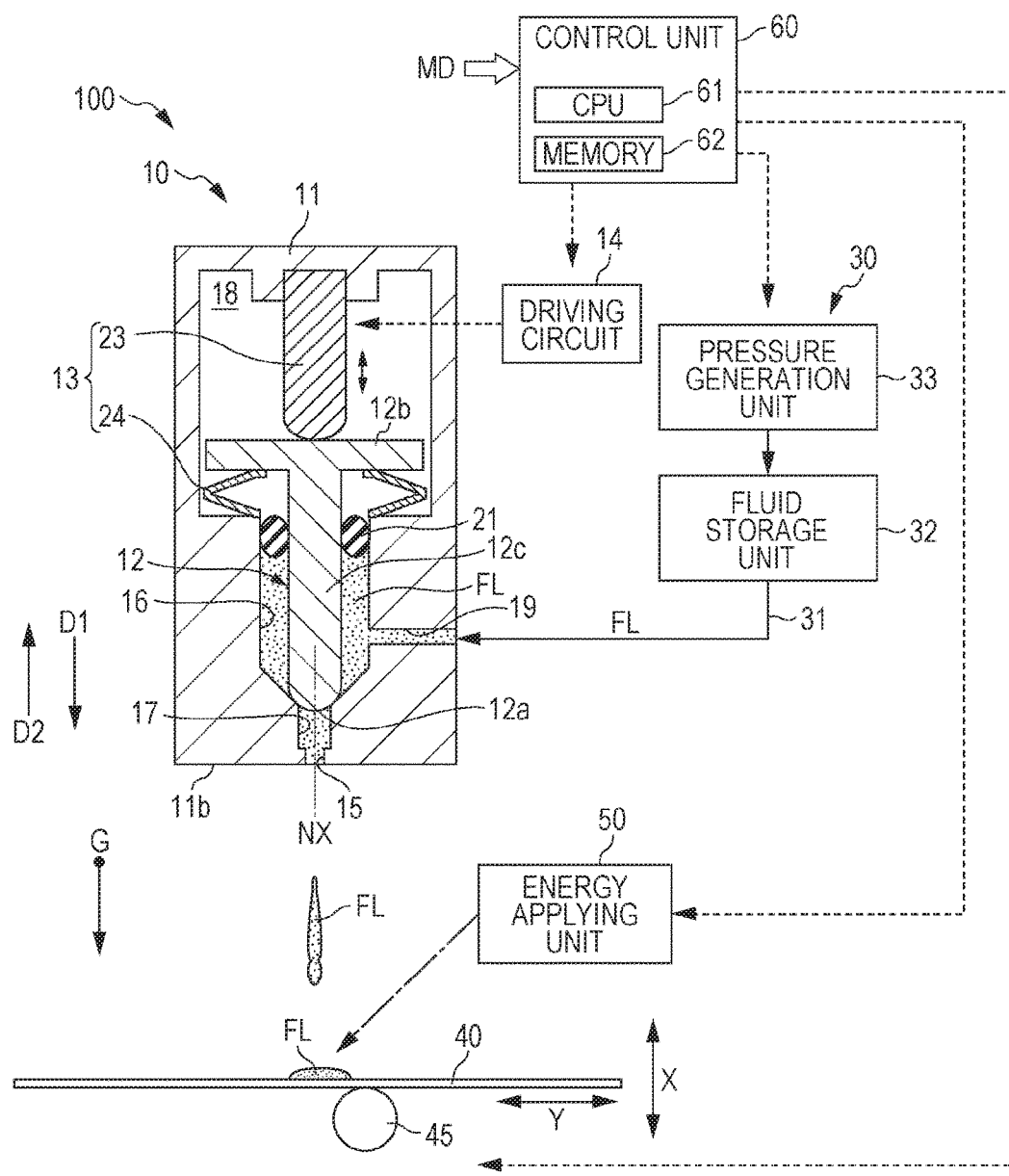
FIG. 1 is a schematic diagram illustrating a configuration of a fluid discharging apparatus in a first exemplary embodiment.

FIG. 1 is a schematic diagram illustrating a configuration of a fluid discharging apparatus 100 in a first exemplary embodiment of the invention. FIG. 1 illustrates an arrow G which indicates a gravity direction (vertical direction) when the fluid discharging apparatus 100 is disposed in a general use state. In this specification, a direction described as "up" or "down" means a direction using the vertical direction as a reference, so long as particular statements are not made. FIG. 1 illustrates arrows which indicate, respectively, a first direction D1 and a second direction D2 which will be described later. The arrows G, D1, and D2 are appropriately illustrated in the drawings referring in this specification.

The fluid discharging apparatus 100 is a 3D printer which is a three-dimensional modeling device. The fluid discharging apparatus 100 models a three-dimensional object by discharging a fluid FL and piling a layer which has been obtained by curing the fluid FL. In this specification, "discharge" means that a fluid is released outwardly from a space in which the fluid is accommodated, by any force including gravity, and has a concept of including "ejection" of releasing a fluid by pressure. A specific example of a fluid FL which is discharged as a material of a three-dimensional object as a modeling target by the fluid discharging apparatus 100 will be described later. The fluid discharging apparatus 100 includes a discharging unit 10, a supply unit 30, a modeling stage 40, a moving mechanism 45, an energy applying unit 50, and a control unit 60.

The discharging unit 10 corresponding to a head unit in a 3D printer and discharges a fluid FL which is a material having fluidity, in a form of a fluid droplet. The "fluid droplet" means a particulate lump of a fluid and means a liquid droplet in a case where the fluid is a liquid. The shape of the fluid droplet is not limited. The shape of the fluid droplet may be spherical or may be a shape in which a spherical shape is extended in one direction, or a shape of, for example, a needle shape or a rod shape. The number of discharged fluid droplets for one discharge is not limited to 1 and a plurality of fluid droplets may be assumed to be discharged. The discharging unit 10 includes an accommodation unit 11, a moving object 12, a driving mechanism 13, and a driving circuit 14.

The accommodation unit 11 is configured as a hollow container and accommodates a fluid FL discharged by the discharging unit 10. In the exemplary embodiment, the accommodation unit 11 has a shape which is substantially cylindrical, and is configured of, for example, stainless steel. A discharge port 15 which functions as a nozzle for discharging the fluid FL is provided in the bottom surface 11b of the accommodation unit 11.

The discharge port 15 is provided as a through-hole which communicates with the internal space of the accommodation unit 11 and has an opening section having a substantially circle shape. In the exemplary embodiment, the discharge port 15 is opened in the vertical direction. An opening diameter of the discharge port 15 may be about 10 to 200 µm, for example. The length of the discharge port 15 in the vertical direction may be about 10 to 30 µm, for example.

The accommodation unit 11 includes a storage chamber 16, a pressure chamber 17, and a driving chamber 18. The storage chamber 16 stores the fluid FL. The storage chamber 16 is connected to a flow passage 19 for receiving the fluid FL which is supplied from the supply unit 30 by pressure. The flow passage 19 is configured as a pipeline which penetrates an outer wall of the accommodation unit 11. A tapered portion in which an inclined wall surface which is inclined downwardly toward the discharge port 15 has a diameter which is reduced downwardly is formed at a lower end of the storage chamber 16. The tapered portion may be omitted and the bottom surface of the storage chamber 16 may be configured by a substantially horizontal surface.

The pressure chamber 17 is positioned under the storage chamber 16. The pressure chamber 17 spatially continues to the storage chamber 16 and is opened at the lower end of the storage chamber 16. The discharge port 15 is opened at a lower end of the pressure chamber 17. As will be described later, the pressure chamber 17 is spatially separated from the storage chamber 16 by the moving object 12, when the moving object 12 is disposed at a closed position at which the discharge port 15 is closed. The opening area of the pressure chamber 17 in a section which is perpendicular to an opening direction of the discharge port 15 is greater than the opening area of the discharge port 15, and flow path resistance of the pressure chamber 17 is smaller than the flow path resistance of the discharge port 15.

The driving chamber 18 is positioned over the storage chamber 16 and accommodates the driving mechanism 13. The driving chamber 18 is spatially separated from the storage chamber 16 by a sealing member 21 which will be described later, such that the fluid FL stored in the storage chamber 16 is not entered. Thus, the driving mechanism 13 is protected from the fluid FL.

The moving object 12 is accommodated in the accommodation unit 11. The moving object 12 is disposed over the discharge port 15. In the exemplary embodiment, the moving object 12 is configured by a metal columnar member. The moving object 12 is disposed so as to cause the central axis of the moving object 12 to coincide with the central axis NX of the discharge port 15. The shape of the moving object 12 is not limited to the columnar shape. The moving object 12 may have, for example, a substantially triangular pyramid shape or a substantially spherical shape.

The moving object 12 is disposed over the storage chamber 16 and the driving chamber 18. The tip portion 12a of the moving object 12 is accommodated in the storage chamber 16. The rear end portion 12b of the moving object 12 is accommodated in the driving chamber 18. In the exemplary embodiment, the tip portion 12a of the moving object 12 has a hemispherical shape. The rear end portion 12b of the moving object 12 has a substantially disc shape projected in a horizontal direction. The main body portion 12c of the moving object 12 between the tip portion 12a and the rear end portion 12b has a substantially columnar shape. The diameter of the main body portion 12c may be about 0.3 to 5 mm, for example.

An annular sealing member 21 which is configured by a resin O-ring is disposed at a boundary between the storage chamber 16 and the driving chamber 18. The main body portion 12c of the moving object 12 is inserted into a through-hole at the middle of the sealing member 21. The outer circumferential surface of the sealing member 21 is air-tightly in contact with the inner wall surface of the accommodation unit 11. The inner circumferential surface of the sealing member 21 is air-tightly in contact with the main body portion 12c of the moving object 12. Thus, the storage chamber 16 and the driving chamber 18 are spatially separated from each other, as described above.

The moving object 12 is disposed in the accommodation unit 11, so as to be movable in a first direction D1 toward the discharge port 15 and in a second direction D2 away from the discharge port 15. In the exemplary embodiment, the first direction D1 and the second direction D2 together are parallel to the central axis of the moving object 12 and are parallel to the vertical direction. In the exemplary embodiment, the moving object moves back and forth in the vertical direction. The moving object 12 moves while rubbing the inner circumferential surface of the sealing member 21. In the exemplary embodiment, the moving object 12 moves in a range of about 10 to 500 µm.

When being positioned at the lowest side position, the tip portion 12a of the moving object 12 comes into line-contact with the circumferential portion of an opening of the pressure chamber 17 in the storage chamber 16. Thus, the discharge port 15 is closed against the storage chamber 16 and a spatial connection between the storage chamber 16 and the discharge port 15 is cut off. In this specification, the position of the moving object 12 at this time is referred to as "a closed position".

The driving mechanism 13 applies a driving force for movement to the moving object 12. The driving mechanism 13 includes a piezoelectric element 23 and an elastic member 24. The piezoelectric element 23 has a configuration in which a plurality of piezoelectric materials is stacked. The length of the piezoelectric element 23 is changed in a direction in which the piezoelectric materials are stacked, in accordance with the level of a voltage applied to the piezoelectric materials. A voltage is applied to the piezoelectric element 23 from the driving circuit 14.

The upper end portion of the piezoelectric element 23 is fixed to an upper wall surface of the driving chamber 18. The lower end portion of the piezoelectric element 23 is in contact with the rear end portion 12b of the moving object 12. The piezoelectric element 23 is stretched and a load is applied to the moving object 12, and thus the moving object 12 moves in the first direction D1.

The elastic member 24 biases the moving object 12 in the second direction D2. In the exemplary embodiment, the elastic member 24 is configured by a disc spring. The elastic member 24 is disposed on a lower side of the rear end portion 12b of the moving object 12, so as to surround the main body portion 12c. The elastic member 24 applies a force to the rear end portion 12b in the second direction. The elastic member 24 may be configured by a helical spring instead of the disc spring. When the piezoelectric element 23 is contracted, the moving object 12 moves in the second direction D2 by the force applied from the elastic member 24, so as to follow the lower end portion of the piezoelectric element 23.

In the discharging unit 10, the moving object 12 moves to reciprocate, and thus fluid droplets of the fluid FL are discharged from the discharge port 15. A discharging mechanism of a fluid droplet in the discharging unit 10 will be described later. In the discharging unit 10, a wall portion which constitutes the bottom surface 11b of the accommodation unit 11 and in which the discharge port 15 is not provided may be configured by a member which is detachable from the main body of the accommodation unit 11. The above member is detached from the accommodation unit 11, and thus, for example, cleaning or maintenance of the discharge port 15, replacement or the like when deterioration or damage occurs is easily performed. In addition, replacement with various discharge ports 15 having different opening diameters (nozzle diameters) is possible. Further, in the discharging unit 10, each of the components such as the moving object 12, the sealing member 21, and the elastic member 24, which are accommodated in the accommodation unit 11 may be configured to be detachable from the accommodation unit 11. Thus, maintenance of the discharging unit 10 or replacement of the component is easily performed.

The supply unit 30 supplies the fluid FL to the storage chamber 16 of the accommodation unit 11 through the flow passage 19 by pressure. The supply unit 30 includes piping 31, a fluid storage unit 32, and a pressure generation unit 33. The piping 31 connects the flow passage 19 of the accommodation unit 11 and the fluid storage unit 32. The fluid storage unit 32 is a supply source of the fluid FL in the fluid discharging apparatus 100 and is configured by a tank for storing the fluid FL. In the fluid storage unit 32, a solvent is mixed in the stored fluid FL, and thus viscosity of the fluid FL is maintained to be predetermined viscosity. The viscosity of the fluid FL may be about 50 to 40,000 mPa·s, for example.

The pressure generation unit 33 is configured by a pressing pump, for example. The pressure generation unit 33 applies pressure for supplying the fluid FL in the fluid storage unit 32 to the accommodation unit 11 through the piping 31 by pressure. The pressure generation unit 33 applies pressure of, for example, about 0.4 to 0.6 MPa to the fluid FL. In FIG. 1, the pressure generation unit 33 is provided on an upstream side of the fluid storage unit 32. However, the pressure generation unit 33 may be provided on a downstream side of the fluid storage unit 32.

The modeling stage 40 is disposed in the front of the opening direction of the discharge port 15 in the discharging unit 10. The discharging unit 10 discharges the fluid FL to the modeling stage 40 as a target object. A three-dimensional object is modeled by fluid droplets of the fluid FL, which have been landed on the modeling stage 40. In the exemplary embodiment, the modeling stage 40 is configured by a member having a flat plate shape, and is disposed substantially horizontally. The modeling stage 40 is disposed at a position which is separate vertically downwardly from the discharge port 15 by about 1.5 to 3 mm, for example.

The moving mechanism 45 includes a motor or a roller, a shaft, and various actuators which are used for displacing the modeling stage 40 with respect to the discharging unit 10. The moving mechanism 45 displaces the modeling stage 40 relatively with respect to the discharging unit 10 in the horizontal direction and in the vertical direction, as represented by both the arrows X and Y in FIG. 1. Thus, the landed position of the fluid FL on the modeling stage 40 is adjusted. The fluid discharging apparatus 100 may have a configuration in which the modeling stage 40 is fixed and the discharging unit 10 is displaced with respect to the modeling stage 40.

The energy applying unit 50 applies energy to the fluid FL landed on the modeling stage 40 so as to cure the fluid FL. In the exemplary embodiment, the energy applying unit 50 is configured by a laser device. The energy applying unit 50 applies light energy to the fluid FL by irradiation with laser. The energy applying unit 50 includes at least a laser light source, a condensing lens, and a galvano mirror (illustrations thereof are omitted). The condensing lens condenses laser emitted from the laser light source on the fluid FL landed on the modeling stage 40. The galvano mirror is used for scanning with laser. The energy applying unit 50 scans a landed position of the fluid droplet on the modeling stage 40 with laser and causes light energy of the laser to sinter the powder material in the fluid FL. Alternatively, the powder material in the fluid FL is melted and combined. Accordingly, a material layer constituting a three-dimensional object is formed on the modeling stage 40.

The energy applying unit 50 may cure the fluid FL by a method other than laser irradiation. The energy applying unit 50 may cure the fluid FL by irradiation with an ultraviolet ray or may remove at least a portion of a solvent of the fluid FL by heating of a heater and cure the powder material.

The control unit 60 is configured by a computer which includes a CPU 61 and a memory 62. The CPU 61 conducts various functions for controlling the fluid discharging apparatus 100 by reading and executing a computer program in the memory 62. The control unit 60 controls each of the discharging unit 10, the supply unit 30, the moving mechanism 45, and the energy applying unit 50 which have been described above, to perform modeling processing for modeling a three-dimensional object.

The control unit 60 receives data MD for modeling a three-dimensional object from an external computer (illustration thereof is omitted) which is connected to the fluid discharging apparatus 100. Data representing each of material layers which are stacked in a height direction of the three-dimensional object is included in the data MD. The control unit 60 determines a timing of discharging fluid droplets of the fluid FL to the discharging unit 10 or the size of the fluid droplet, based on the data MD. The control unit 60 determines a landed position of the fluid droplet of the fluid FL on the modeling stage 40, or a laser irradiation position and an irradiation timing by the energy applying unit 50, based on the data MD. The three-dimensional object modeled on the modeling stage 40 may be obtained through a sintering process in a heating furnace, if necessary.

The control unit 60 transmits a driving signal to the driving circuit 14 in the modeling processing, and thus controls moving of the moving object 12 and causes the fluid FL to be discharged to the discharging unit 10 in the discharging unit 10. Control of the moving object 12 by the control unit 60 at this time will be described later.

With the above configuration, the fluid discharging apparatus 100 in the exemplary embodiment models a three-dimensional object which uses the fluid FL which is a discharging target, as a material. Specific examples of the fluid FL which is the material of the three-dimensional object will be described. In the exemplary embodiment, the fluid FL is a flowable composition which has a paste shape and includes a powder material and a solvent. The fluid FL may include a powder material and a solvent. Examples of the powder material may include single powder of magnesium (Mg), iron (Fe), cobalt (Co), chrome (Cr), aluminium (Al), titanium (Ti), copper (Cu), and nickel (Ni), alloy powder including one kind or more of the above metal (maraging steel, stainless steel, cobalt chromium molybdenum, titanium alloy, nickel alloy, aluminum alloy, cobalt alloy, and cobalt chromium alloy), and mixture powder obtained by mixing one or two kinds or more selected from the single powder or alloy powder. Examples of the solvent of the fluid FL may include water; (poly)alkylene glycol monoalkyl ethers such as ethylene glycol monomethyl ether, ethylene glycol monoethyl ether, propylene glycol monomethyl ether, and propylene glycol monoethyl ether; acetic acid esters such as ethyl acetate, n-propyl acetate, iso-propyl acetate, n-butyl acetate, and iso-butyl acetate; aromatic hydrocarbons such as benzene, toluene, and xylene; ketones such as methyl ethyl ketone, acetone, methyl isobutyl ketone, ethyl-n-butyl ketone, diisopropyl ketone, and acetyl acetone; alcohols such as ethanol, propanol, and butanol; tetraalkyl ammonium acetates; sulfoxide solvents such as dimethyl sulfoxide and diethyl sulfoxide; pyridine solvents such as pyridine, γ-picoline, and 2,6-lutidine; ionic liquids such as tetraalkyl ammonium acetate (for example, tetrabutyl ammonium acetate); and mixtures of one or two kinds or more selected from the above solvents.

The fluid FL may be a mixed material which is obtained by mixing a binder to the powder material and the solvent and has a slurry shape or a paste shape. Examples of the binder may include acrylic resin, epoxy resin, silicone resin, cellulose resin, other synthetic resins, or PLA (polylactic acid), PA (polyamide), PPS (polyphenylene sulfide), other thermoplastic resins. The fluid FL is not limited to a fluid including the powder material. Examples of the fluid FL may include a fluid in which resin such as general-purpose engineering plastics (for example, polyamide, polyacetal, polycarbonate, modified polyphenylene ether, polybutylene terephthalate, and polyethylene terephthalate) is melted. In addition, the fluid FL may be resin such as engineering plastics (for example, polysulfone, polyethersulfone, polyphenylene sulfide, polyarylate, polyimide, polyamide imide, polyether imide, and polyether etherketone). The fluid FL may include metal other than the above-described metal, ceramics, resin, or the like. The fluid FL may include a sintering aid.

Figure 2:
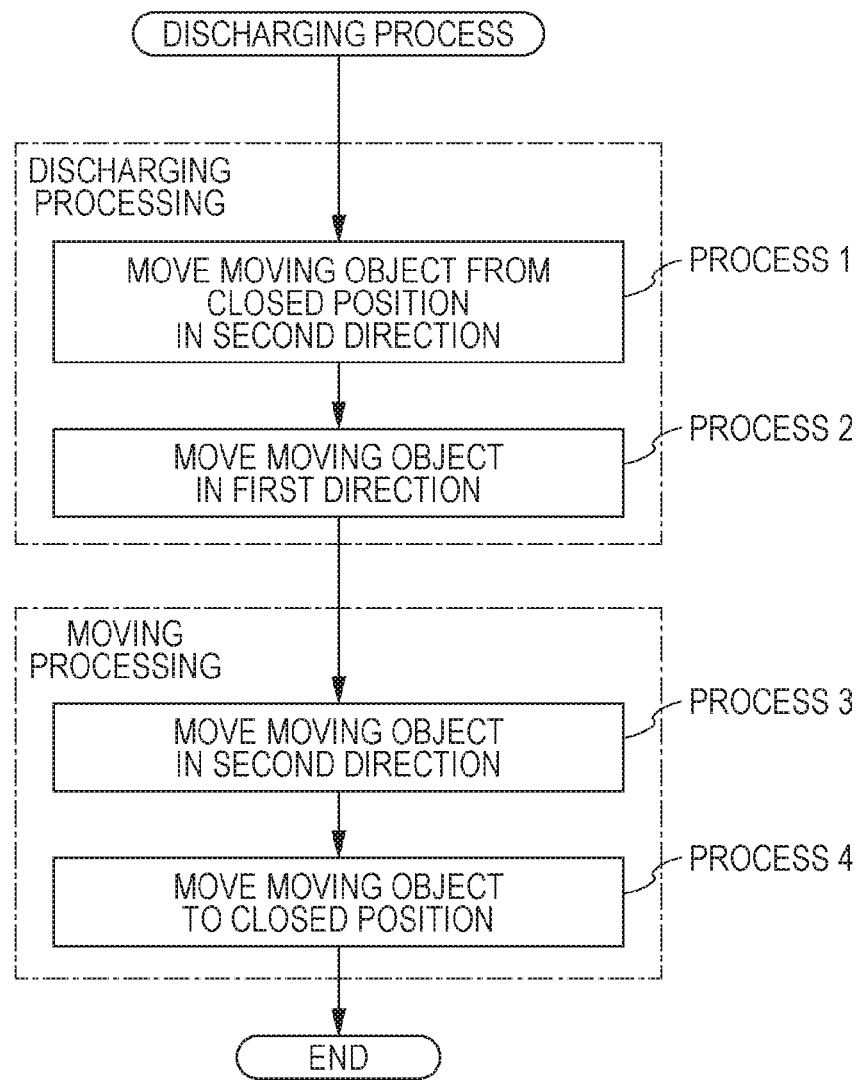
FIG. 2 is a flowchart illustrating a flow of a discharging process of a fluid.
Figure 3:
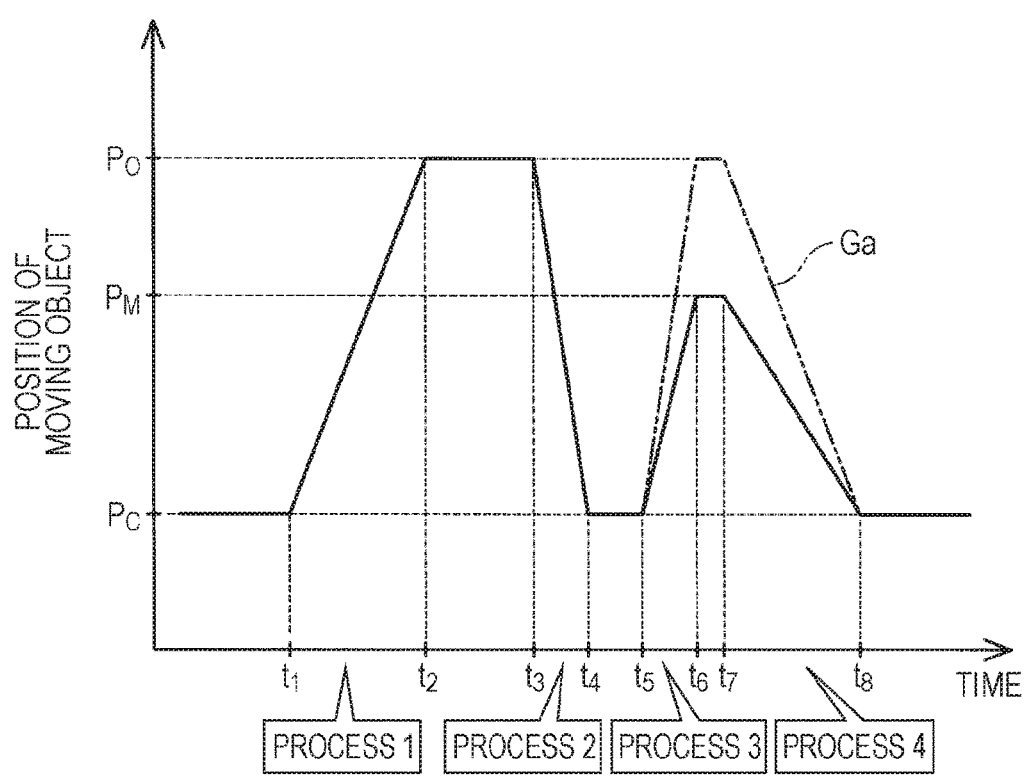
FIG. 3 is a diagram illustrating a relationship between a position of a moving object and a time in the discharging process.
Figure 4A:
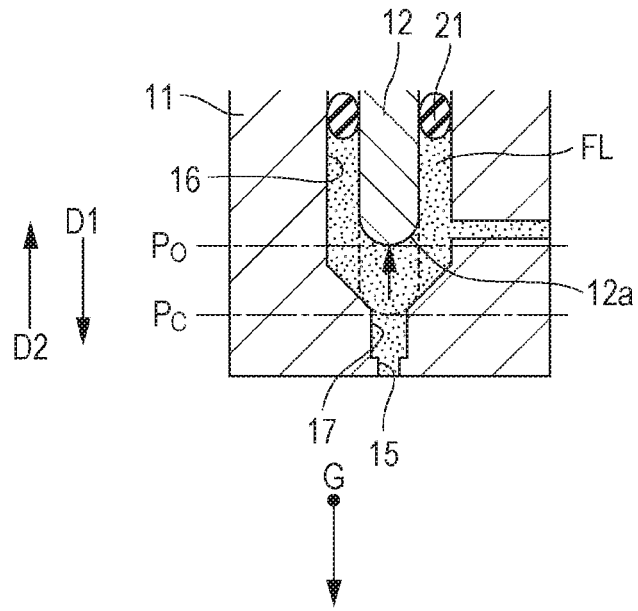
FIG. 4A is a schematic diagram illustrating details of Process 1 in discharging processing.
Figure 4B:
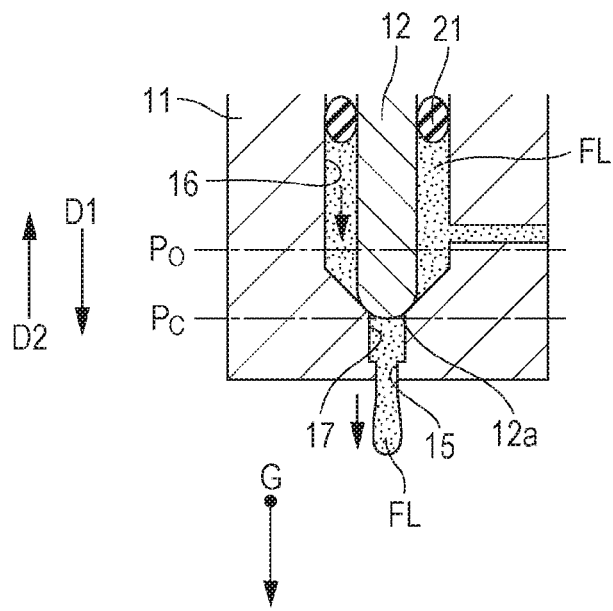
FIG. 4B is a schematic diagram illustrating details of Process 2 in the discharging processing.
Figure 5A:
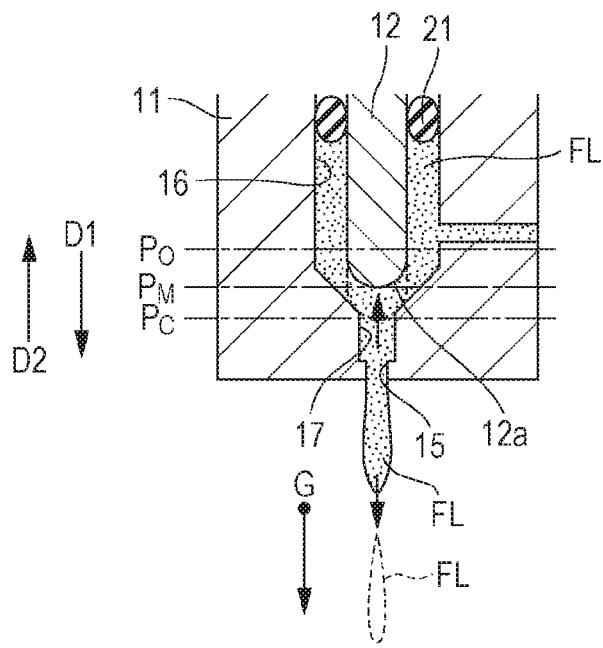
FIG. 5A is a schematic diagram illustrating details of Process 3 in moving processing.
Figure 5B:
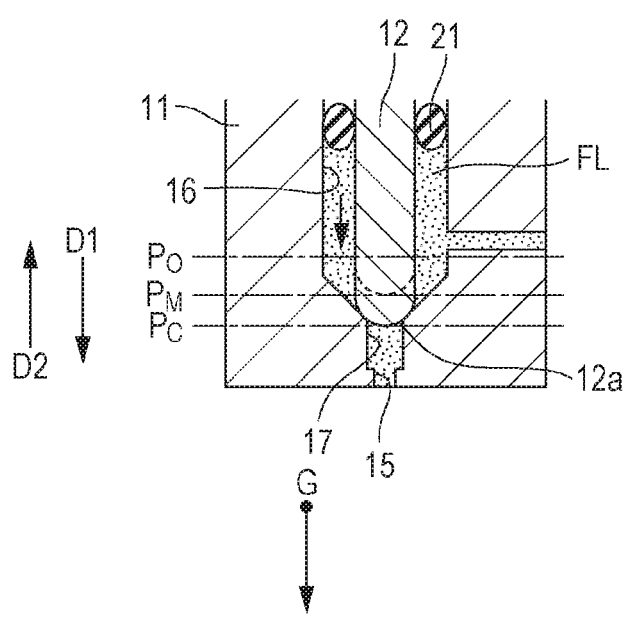
FIG. 5B is a schematic diagram illustrating details of Process 4 in the moving processing.

The discharging process of the fluid FL in the fluid discharging apparatus 100 and control of the moving object 12 by the control unit 60 in the discharging process will be described with reference to FIGS. 2 to 5B. FIG. 2 is a flowchart illustrating a flow of the discharging process of the fluid FL. FIG. 3 is a diagram illustrating an example of a graph representing a relationship between the position of the moving object 12 and a time in the discharging process. The position of the moving object 12 in a vertical axis of the graph in FIG. 3 corresponds to the level of a voltage applied to the piezoelectric element 23 by the driving circuit 14. FIGS. 4A and 4B are schematic diagrams illustrating details of the discharging processing performed in the discharging process. FIGS. 5A and 5B are schematic diagrams illustrating details of the moving processing performed in the discharging process. Each of FIGS. 4A, 4B, 5A, and 5B illustrates a form of a vicinity region of the discharge port 15 in the accommodation unit 11.

The control unit 60 performs the following discharging process when a discharging timing of the fluid FL by the discharging unit 10 is reached in the modeling processing. If the discharging process which will be described below is performed one time, fluid droplets of an amount as much as one dot are discharged. Firstly, the control unit 60 sequentially performs Process 1 and Process 2 as the discharging processing.

In Process 1, the control unit 60 controls the driving circuit 14 to apply a voltage to the piezoelectric element 23 and thus causes the piezoelectric element 23 to be contracted (time points $t_1$ to $t_2$ in FIG. 3). Thus, the moving object 12 moves from a closed position $P_C$ at which the discharge port 15 is closed, in the second direction D2. The storage chamber 16 and the pressure chamber 17 are in a state of communicating with each other, and the discharge port 15 is opened (FIG. 4A). In Process 1, the moving object 12 reaches an open position $P_O$ which is a position farthest from the discharge port 15 in a moving range of the moving object 12. A moving period (time points $t_1$ to $t_2$) of the moving object 12 in the second direction in Process 1 may be about 50 to 400 μs, for example.

Then, the voltage applied to the piezoelectric element 23 is maintained during a short waiting time (time points $t_3$ to $t_4$ in FIG. 3) which has been predetermined, and the moving object 12 is held at the open position $P_O$. During the period, the fluid FL flows into a region between the tip portion 12a of the moving object 12 and the discharge port 15 by using the pressure of the storage chamber 16 as a driving force, and thus the fluid FL is replenished. The waiting time at this time may be appropriately determined in accordance with the viscosity of the fluid FL, pressure applied to the fluid FL by the pressure generation unit 33, the volume of the storage chamber 16, and the like. The waiting time may be about 100 to 300 μs, for example.

In Process 2, the control unit 60 changes the voltage applied to the piezoelectric element 23 by the driving circuit 14 so as to stretch the piezoelectric element 23 (time points $t_3$ to $t_4$ in FIG. 3). Thus, the moving object 12 moves in the first direction D1, the fluid FL is extruded from the discharge port 15 and discharging the fluid FL is started (FIG. 4B). In the exemplary embodiment, in Process 2, the moving object 12 moves to the closed position $P_C$. The tip portion 12a of the moving object 12 knocks on the inner wall surface of the accommodation unit 11, and thus closes the discharge port 15. Thus, flowing of the fluid FL into the pressure chamber 17 and the discharge port 15 can be temporarily blocked. Accordingly, accuracy of adjusting the amount of the discharged fluid FL is improved.

In Process 2, a speed at which the moving object 12 moves in the first direction D1 may be the same as or greater than a speed at which the moving object 12 moves in the second direction D2 in Process 1. In Process 2, a load applied to the moving object 12 from the piezoelectric element 23 may be determined in accordance with aimed pressure of the fluid FL at the discharge port 15 when the fluid FL is discharged from the discharge port 15. For example, in a case where the aimed pressure is about 900 to 1100 MPa, the load applied to the moving object 12 by the piezoelectric element 23 may be about several hundred N.

After discharging the fluid FL from the discharge port 15 is started by Process 2, the control unit 60 starts the moving processing during a period when the fluid FL is discharged from the discharge port 15. The "period when the fluid FL is discharged from the discharge port 15" means a period when a columnar fluid FL is suspended from the discharge port 15 and does not include a period after the tip portion of the columnar fluid FL is separated as a fluid droplet. That is, the period is a period after discharging of the fluid FL from the discharge port 15 is started and before a fluid droplet of the fluid FL is formed. This period varies depending on the viscosity of the fluid FL, pressure of the fluid FL at the discharge port 15, or the like. The control unit 60 performs Process 2, and then starts the moving processing at an elapsed time point which has been predetermined and at which it is expected that the fluid FL is in a state of being discharged from the discharge port 15. For example, the control unit 60 may start the moving processing after a period of 0.001 to 0.04 s elapses from when Process 2 is performed. The control unit 60 sequentially performs Process 3 and Process 4 as the moving processing.

In Process 3, the control unit 60 controls the driving circuit 14 to apply a voltage to the piezoelectric element 23 and thus causes the piezoelectric element 23 to be contracted again (time points $t_5$ to $t_6$ in FIG. 3). Thus, moving of the moving object 12 in the second direction D2 is started during the period when the fluid FL is discharged from the discharge port 15. In the exemplary embodiment, in Process 3, the moving object 12 moves to an intermediate position $P_M$ between the closed position $P_C$ and the open position $P_O$ (FIG. 5A).

The moving object 12 is moved in the second direction D2 in Process 3, and thus a force from the discharge port 15 into the storage chamber 16 can be generated in the fluid FL discharged from the discharge port 15. Thus, an inertial force and gravity at a time of discharging act on a portion of the fluid FL on a lower end side thereof which is suspended from the discharge port 15, and a force which draws the fluid FL into the accommodation unit 11 acts on a portion of the fluid FL on an upper end side thereof. Accordingly, moving of the moving object 12 in the second direction D2 causes the tip portion of the fluid FL on the lower end thereof which is suspended from the discharge port 15 to be separated as a fluid droplet and fly, as indicated by a broken line. It can be interpreted that Process 3 is a process of moving the moving object 12 in the second direction D2 and separating a fluid droplet from a columnar fluid FL. In addition, in Process 3, the moving object 12 moves in the second direction D2, and thus an inertial force in a direction in which the fluid FL is drawn back into the accommodation unit 11 is generated and an occurrence of a situation in which the fluid FL remains at an outer portion of the discharge port 15 is suppressed. In particular, in the exemplary embodiment, the moving object 12 is moved from the closed position $P_C$ in the second direction D2, and thus the force which brings the fluid FL back into the accommodation unit 11 is increased. Further, the occurrence of a situation in which the fluid FL remains at an outer portion of the discharge port 15 is more suppressed.

In Process 3, as illustrated by a graph Ga of a two-dot chain line in FIG. 3, the moving object 12 may be moved to the open position $P_O$. It is desirable that a moving distance of the moving object 12 in Process 3 is the same as or smaller than a moving distance of the moving object 12 in Process 1 (time points $t_1$ to $t_2$). Thus, an occurrence of a situation in which the moving distance of the moving object 12 is wastefully increased is suppressed and efficiency is increased. In particular, if the moving distance of the moving object 12 in Process 3 is smaller than the moving distance of the moving object 12 in Process 1, an occurrence of a situation in which an outside air enters into the accommodation unit 11 from the discharge port 15 in Process 3 is suppressed. It is desirable that a period (time points $t_6$ to $t_8$ in FIG. 3) until Process 4 is started after Process 3 is a period as short as the large amount of the fluid FL does not flow into a region between the tip portion 12a of the moving object 12 and the discharge port 15. It is desirable that the period of time points $t_6$ to $t_8$ is at least a period shorter than the period of the time points $t_2$ to $t_3$. The period may be substantially omitted. Thus, an occurrence of a situation in which the fluid FL is extruded from the discharge port 15 in Process 4 is suppressed.

In Process 4, the control unit 60 changes a voltage applied to the piezoelectric element 23 by the driving circuit 14. Thus, the piezoelectric element 23 is stretched and the moving object 12 is brought back to the closed position $P_C$ (time points $t_7$ to $t_8$ in FIG. 3, FIG. 5B). Accordingly, a communication state between the discharge port 15 and the storage chamber 16 is cut off by the moving object 12 and an occurrence of leakage of the fluid FL from the discharge port 15 is suppressed. It is desirable that a speed when the moving object 12 is moved in the first direction D1 in Process 4 is slower than a speed when the moving object 12 is moved in the first direction D1 in Process 2. Thus, an occurrence of a situation in which the fluid FL is discharged from the discharge port 15 by moving the moving object 12 in Process 4 is suppressed. It is possible to relieve an impact when the moving object 12 collides with the inner wall surface of the accommodation unit 11 at the closed position $P_C$, and thus deterioration of the discharging unit 10 is suppressed.

As described above, according to the fluid discharging apparatus 100 and the method of discharging the fluid FL in the discharging process thereof in the exemplary embodiment, the moving object 12 is moved in the second direction D2 during a period when the fluid FL is discharged from the discharge port 15. Thus, separation of a fluid droplet from a columnar fluid FL which is suspended from the discharge port 15 is accelerated. An occurrence of a situation in which the fluid FL remains on the outside of the discharge port 15 after the discharging process is suppressed. Thus, an occurrence of a situation in which the redundant fluid FL is provided in the circumferential region of the discharge port 15, which includes the discharge port 15, and thus discharging of the next fluid FL is disturbed is suppressed. For example, an occurrence of a situation in which there is a mistake in the amount of the discharged fluid FL in the next discharging process or a situation in which a flying state of a fluid droplet of the fluid FL discharged in the next discharging process is deteriorated is suppressed. Thus, it is possible to smoothly and continuously perform discharging of a fluid droplet of the fluid FL. Since an occurrence of a situation in which the redundant fluid FL adheres to the circumferential region of the discharge port 15 is suppressed, it is possible to reduce the number of times of performing cleaning processing of the circumferential region of the discharge port 15, and efficiency is increased. Furthermore, according to the fluid discharging apparatus 100 and the method of discharging the fluid FL in the discharging process thereof in the exemplary embodiment, it is possible to obtain various advantages described in the above exemplary embodiment.

B. Second Exemplary Embodiment

Figure 6:
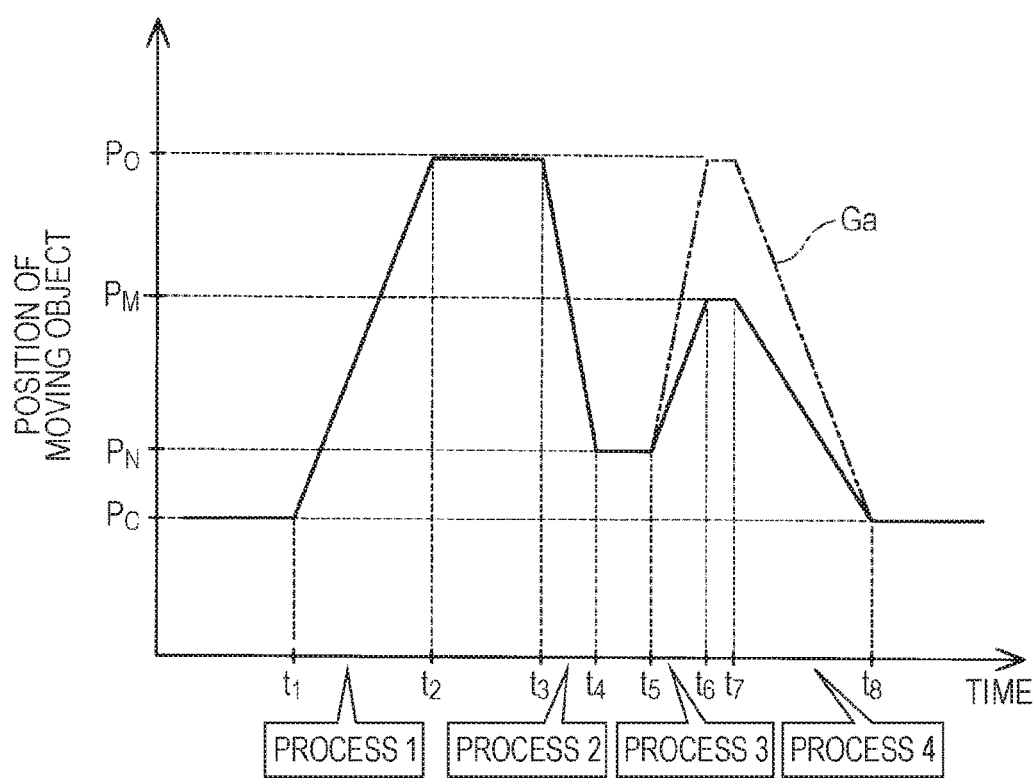
FIG. 6 is a diagram illustrating a discharging process in a second exemplary embodiment.

FIG. 6 is a diagram illustrating a discharging process in a second exemplary embodiment of the invention. FIG. 6 is substantially the same as FIG. 3 having referred in the first exemplary embodiment except that the moving object 12 stops in a region between the closed position $P_C$ and an intermediate position $P_M$ at the time points $t_4$ to $t_5$. A fluid discharging apparatus in the second exemplary embodiment has a configuration which is substantially the same as that of the fluid discharging apparatus 100 in the first exemplary embodiment (FIG. 1). A discharging process performed in the fluid discharging apparatus in the second exemplary embodiment is substantially the same as the process described in the first exemplary embodiment except for points which will be described below.

In the discharging process in the second exemplary embodiment, the control unit 60 causes the moving object 12 not to reach the closed position $P_C$ and but to stop at a return position $P_N$ which is a position between the closed position $P_C$ and the intermediate position $P_M$, in Process 2 of the discharging processing (time points $t_4$ to $t_5$). In Process 3 of the moving processing, the moving object 12 is moved from the return position $P_N$, in the first direction D1. The return position $P_N$ may be a position which is experimentally predetermined so as to cause the fluid FL having a desired amount until the moving object 12 reaches the above position to be discharged from the discharge port 15.

Even in a case of the fluid discharging apparatus and the method of discharging the fluid FL in the discharging process in the second exemplary embodiment, similarly to those described in the first exemplary embodiment, it is possible to suppress the occurrence of a situation in which a redundant fluid FL is provided on the outside of the discharge port 15, while a fluid droplet of the fluid FL is separated by the Process 3 of the moving processing. According to the fluid discharging apparatus and the method of discharging the fluid FL in the discharging process in the second exemplary embodiment, since the tip portion 12a of the moving object 12 does not collide with the inner wall surface of the accommodation unit 11 in Process 2, it is possible to suppress deterioration of the accommodation unit 11, which results from the collision. Further, it is possible to reduce a moving distance of the moving object 12 in the discharging process, and thus the discharging process is performed with high efficiency. Furthermore, according to the fluid discharging apparatus and the method of discharging the fluid FL in the discharging process in the second exemplary embodiment, it is possible to exhibit various advantages which are similar to those described in the first exemplary embodiment.

C. Third Exemplary Embodiment

Figure 7:
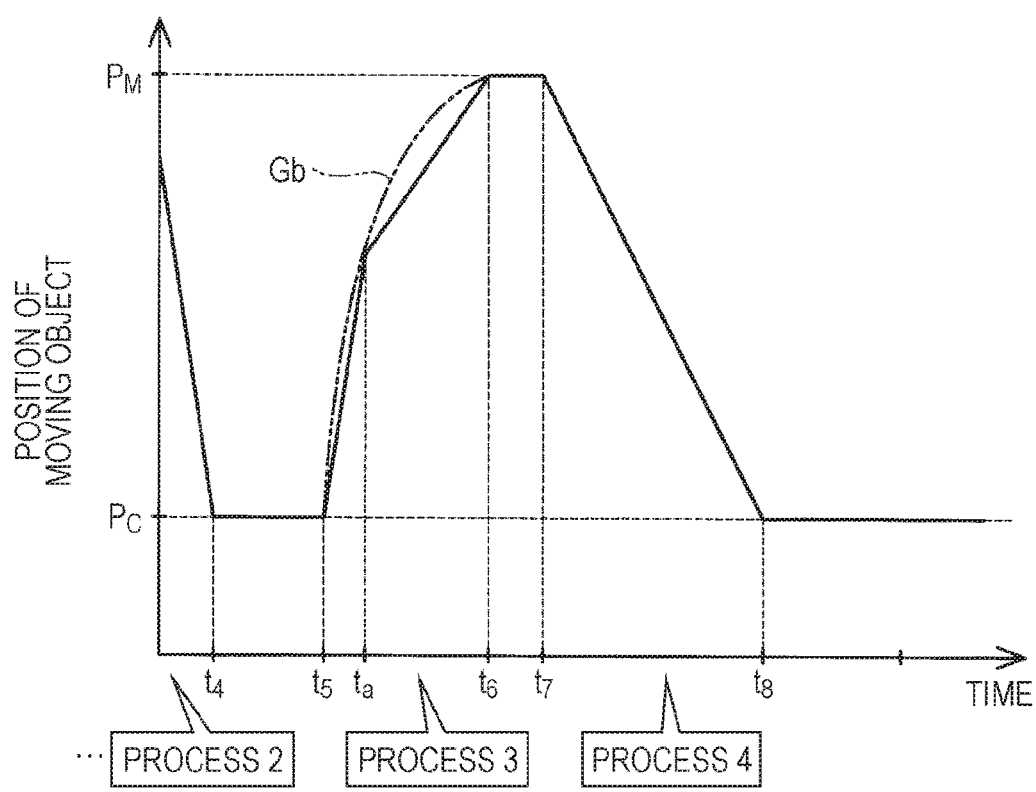
FIG. 7 is a diagram illustrating a discharging process in a third exemplary embodiment.

FIG. 7 is a diagram illustrating a discharging process in a third exemplary embodiment of the invention. FIG. 7 illustrates an example of a graph representing the relationship between the position of the moving object 12 and a time in the discharging process. In the graph in FIG. 7, for convenience, only a period of time points $t_4$ to $t_8$ when Processes 3 and 4 of the moving processing are performed in the discharging process is illustrated. In the third exemplary embodiment, a fluid discharging apparatus has a configuration which is substantially the same as that of the fluid discharging apparatus 100 in the first exemplary embodiment (FIG. 1). The discharging process performed in the fluid discharging apparatus in the third exemplary embodiment is substantially the same as the process described in the first exemplary embodiment except for points which will be described below.

The discharging process in the third exemplary embodiment is substantially the same as the discharging process in the first exemplary embodiment except that the control unit 60 changes the moving speed of the moving object 12 in Process 3. In the discharging process in the third exemplary embodiment, the control unit 60 changes the moving speed of the moving object 12 from a first speed $v_1$ which is an initial moving speed to a second speed $v_2$ which is slower than the first speed $v_1$, at a time point $t_a$ in the middle of Process 3 of the moving processing. Since the speed of the moving object 12 is high during a period of the time points $t_5$ to $t_a$, it is possible to quickly separate a fluid droplet from the fluid FL discharged from the discharge port 15. Since the speed of the moving object 12 is low during a period of the time points $t_a$ to $t_6$, the occurrence of a situation in which an outside air is entered into the accommodation unit 11 through the discharge port 15 is suppressed. In Process 3, the control unit 60 may gradually decrease the speed of the moving object 12 as illustrated by a graph Gb of a two-dot chain line in FIG. 7. Thus, the control unit 60 may change the speed of the moving object 12 from the first speed $v_1$ to the second speed $v_2$.

As described above, according to the fluid discharging apparatus and the method of discharging the fluid FL in the discharging process in the third exemplary embodiment, it is possible to suppress entering of an outside air into the accommodation unit 11 with improving separability of a fluid droplet, by controlling the speed of the moving object 12 in Process 3. Furthermore, according to the fluid discharging apparatus and the method of discharging the fluid FL in the discharging process in the third exemplary embodiment, it is possible to exhibit various advantages which are similar to those described in the first exemplary embodiment.

D. Fourth Exemplary Embodiment

Figure 8:
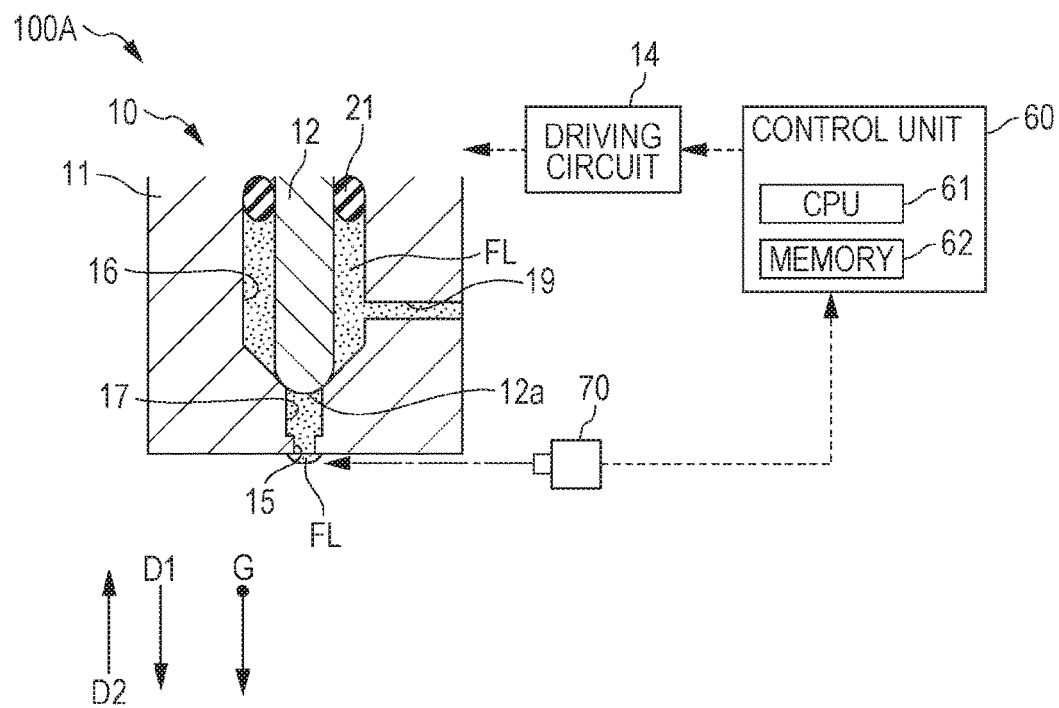
FIG. 8 is a schematic diagram illustrating a configuration of a fluid discharging apparatus in a fourth exemplary embodiment.

FIG. 8 is a schematic diagram illustrating a configuration of a fluid discharging apparatus 100A in a fourth exemplary embodiment of the invention. For convenience, FIG. 8 illustrates only some components of the fluid discharging apparatus 100A. The fluid discharging apparatus 100A in the fourth exemplary embodiment has a configuration which is substantially the same as the configuration of the fluid discharging apparatus 100 in the first exemplary embodiment except that a fluid detection unit 70 is added. A discharging process performed by the fluid discharging apparatus 100A in the fourth exemplary embodiment is substantially the same as that described in the first exemplary embodiment except that the moving speed or the moving distance of the moving object 12 is changed in accordance with a detection result of the fluid detection unit 70, as will be described below.

The fluid detection unit 70 detects a fluid FL adhering to the circumferential region of the discharge port 15 on the outside of the accommodation unit 11, under the control of the control unit 60. The circumferential region of the discharge port 15 includes a region under the discharge port 15. The fluid detection unit 70 includes an imaging device configured by a CCD image sensor or the like. The fluid detection unit 70 captures an image of the circumferential region of the discharge port 15 during a period when the discharging unit 10 does not discharge the fluid FL, and analyzes the captured image. The thickness of a film of the fluid FL which is formed to cover the discharge port 15 under the discharge port 15, or the area of an image of the film is detected as a value indicating the amount of the fluid FL provided in the circumferential region of the discharge port 15.

The control unit 60 changes at least one of a distance and a speed when the moving object 12 moves in the second direction D2, in accordance with the amount of the fluid FL detected by the fluid detection unit 70, in Process of the next discharging process. The control unit 60 changes the voltage which is applied to the piezoelectric element 23 by the driving circuit 14.

The control unit 60 may perform a control to cause the moving distance of the moving object 12 to be increased as the amount of the fluid FL detected by the fluid detection unit 70 becomes more. The control unit 60 may perform a control to cause the moving speed of the moving object 12 to become faster as the amount of the fluid FL detected by the fluid detection unit 70 becomes more. In the above controls, the control unit 60 may use a map or an expression which has been prepared in advance. The control unit 60 may increase one or both of the moving distance and the moving speed of the moving object 12 in comparison to a case where the detected amount of the fluid FL is equal to or smaller than the threshold, when the amount of the fluid FL detected by the fluid detection unit 70 is greater than a predetermined threshold.

If the moving distance or the moving speed of the moving object 12 in Process 3 is set to be large, it is possible to increase a force which acts in a direction in which the fluid FL discharged from the discharge port 15 is attracted into the accommodation unit 11. Thus, for example, even though the fluid FL which is not attracted into the accommodation unit 11 by the moving processing is provided during the continuous discharging process of the fluid FL until now, it is possible to reduce such the remaining fluid FL by the moving processing of the subsequent discharging process. A control in which the moving distance of the moving object 12 in Process 3 is generally set to be short, and thus entering of the outside air from the discharge port 15 is suppressed and a control in which the moving distance of the moving object 12 is increased when the remaining amount of the fluid FL accumulated in the circumferential region of the discharge port 15 is high are possible.

As described above, according to the fluid discharging apparatus and the method of discharging the fluid FL in the discharging process in the third exemplary embodiment, it is possible to further suppress an occurrence of a situation in which the fluid FL remains in the circumferential region of the discharge port 15. Furthermore, according to the fluid discharging apparatus and the method of discharging the fluid FL in the discharging process in the third exemplary embodiment, it is possible to exhibit various advantages which are similar to those described in the first exemplary embodiment.

E. MODIFICATION EXAMPLES

E1. Modification Example 1

In each of the exemplary embodiments, the discharging process is performed in the modeling processing of modeling a three-dimensional object. On the other hand, the discharging process may be performed at a time other than the time of the modeling processing. For example, the discharging process may be performed during flushing which is performed for maintenance of the discharging unit 10.

E2. Modification Example 2

In the exemplary embodiments, each of the first direction D1 and the second direction D2 which are moving directions of the moving object 12 are directions parallel to a vertical direction. On the other hands, each of the first direction D1 and the second direction D2 may be not parallel to the vertical direction. The first direction D1 and the second direction D2 may be inclined directions which intersect with the vertical direction. In the exemplary embodiments, an opening direction of the discharge port 15 coincides with the vertical direction. On the other hands, the opening direction of the discharge port 15 may not coincide with the vertical direction. For example, the opening direction of the discharge port 15 may be a direction which intersects with the vertical direction and is directed diagonally downwardly.

E3. Modification Example 3

The configurations of the second exemplary embodiment, the third exemplary embodiment, and the fourth exemplary embodiment may be appropriately combined. For example, in Process 2 in the discharging process of the third exemplary embodiment, the moving object 12 may not reach the closed position $P_C$ and but stop at the intermediate position $P_M$, as described in the second exemplary embodiment. In Process 3 in the discharging process of the second exemplary embodiment and the third exemplary embodiment, the speed or the moving distance of the moving object 12 may be controlled in accordance with the detection result of the fluid detection unit 70, as described in the fourth exemplary embodiment. In Process 3 of the third exemplary embodiment, in a case where the speed of the moving object 12 is controlled in accordance with the detection result of the fluid detection unit 70, the first speed $v_1$ may be increased as the amount of the detected fluid FL in the vicinity region of the discharge port 15 becomes more.

E4. Modification Example 4

In the exemplary embodiments, the control unit 60 may set the speed when moving the moving object 12 to the closed position $P_C$, to be slower than the speed when moving the moving object 12 in the first direction D1 in Process 2, in Process 4. On the other hands, the control unit 60 may set the speed when moving the moving object 12 to the closed position $P_C$, to be equal to or faster than the speed when moving the moving object 12 in the first direction D1 in Process 2, in Process 4.

E5. Modification Example 5

In each of the exemplary embodiments, the pressure chamber 17 of the accommodation unit 11 may be omitted. In this case, the tip portion 12*a* of the moving object 12 at the closed position $P_C$ may come into contact with the inner circumferential portion of the discharge port 15 and may directly close the discharge port 15.

E6. Modification Example 6

In each of the exemplary embodiments, the moving object 12 is displaced with applying a load in accordance with stretching or contracting of the piezoelectric element 23. On the other hand, the moving object 12 may be displaced with applying a load by a method other than the method using the piezoelectric element 23. For example, the moving object 12 may be displaced with applying a load by pressure of a gas. In each of the exemplary embodiments, the moving object 12 may be integrated with the piezoelectric element 23. In addition, a configuration in which the tip portion of the piezoelectric element 23 moves to reciprocate in the accommodation unit 11, as the moving object 12 may be made.

E7. Modification Example 7

In the fourth exemplary embodiment, the fluid detection unit 70 detects the fluid FL in the circumferential region of the discharge port 15 by an optical unit which uses an imaging device. On the other hand, the fluid detection unit 70 may detect the fluid FL in the circumferential region of the discharge port 15 by an optical unit other than the imaging device. For example, the fluid detection unit 70 may detect that the fluid FL having an amount which is equal to or greater than a predetermined amount is provided in the circumferential region of the discharge port 15, by using a photo sensor. The fluid detection unit 70 may detect the fluid FL in the circumferential region of the discharge port 15 by a method other than the method using an optical unit. In the fluid detection unit 70, an electrode may be provided in the circumferential region of the discharge port 15, and the fluid FL provided in the circumferential region of the discharge port 15 may be detected based on a change of resistance when a current flows in the electrode.

E8. Modification Example 8

The fluid discharging apparatus in each of the exemplary embodiments is realized as a three-dimensional modeling device that models a three-dimensional object. On the other hand, the fluid discharging apparatus may be not realized as the three-dimensional modeling device. For example, the fluid discharging apparatus may be realized as an ink jet printer that discharges an ink as the fluid or may be realized as a coating device that discharges a coating material or a working device that discharges an adhesive having fluidity.

E9. Modification Example 9

In each of the exemplary embodiments, some or all of the function and the processing realized by software may be realized by hardware. Some or all of the function and the processing realized by hardware may be realized by software. Various circuits such as an integrated circuit, a discrete circuit, or a circuit module obtained by combining the circuits can be used as the hardware.

The invention is not limited to the exemplary embodiments, the examples, and the modification examples which have been described above, and can be realized with various configuration in a range without departing from the gist of the invention. For example, the technical features in the exemplary embodiments, the examples, and the modification examples, which correspond to the technical features in the form described in the section of the summary can be appropriately replaced or combined in order to solve some or all of the above-described problems or to achieve some or all of the above-described effects. If the technical features thereof are not described as being necessary in this specification, the technical features can be appropriately removed.

The entire disclosure of Japanese Patent Application No. 2016-190760, filed Sep. 29, 2016 is expressly incorporated by reference herein.

What is claimed is:

1. A fluid discharging apparatus comprising:
   a housing that is configured to store a fluid;
   a discharge port that is formed at part of an outer periphery of the housing, the discharge port fluidly communicating with the housing, the discharge port being configured to discharge the fluid;
   a movable object that is housed in the housing, the movable object being configured to move in a first direction toward the discharge port and in a second direction away from the discharge port in the housing;
   a memory that is configured to store a program; and
   a CPU that is configured to execute the program, so as to:
      cause the movable object to move in the first direction so as to close the discharge port at a first position of the movable object;
      cause the movable object to move in the second direction from the first position so as to open the discharge port at a second position of the movable object;
      cause the movable object to move in the first direction from the second position to a third position of the movable object so as to eject the fluid from the discharge port to an outside of the housing; and
      cause the movable object to move in the second direction from the third position while the fluid is ejected from the discharge port,
   wherein the CPU is configured to change a moving speed of the movable object from a first speed to a second speed when the CPU causes the movable object to move in the second direction from the third positon while the fluid is ejected from the discharge port, and the second speed is slower than the first speed.

2. The fluid discharging apparatus according to claim 1, wherein when the CPU causes the movable object to move in the first direction from the second positon so as to eject the fluid, the CPU causes the movable object to move to the first position so as to close the discharge port so that the first position is the same as the third position.

3. The fluid discharging apparatus according to claim 1, wherein the CPU causes the movable object to move in the second direction from the third positon to a fourth position of the movable object while the fluid is ejected from the discharge port, and a distance between the first position and the second position is equal to or less than a distance between the third position and the fourth position.

4. The fluid discharging apparatus according to 1,
   wherein the CPU causes the movable object to move at a third speed in the first direction from the second positon to the third position of the movable object so as to eject the fluid,
   after the CPU causes the movable object to move in the second direction from the third positon to a fourth position of the movable object while the fluid is ejected from the discharge port, the CPU causes the movable object to move at a fourth speed in the first direction from the fourth position to the first position, and
   the fourth speed is slower than the third speed.

5. The fluid discharging apparatus according to claim 1, further comprising:
   a fluid detector that is configured to detect an amount of the fluid adhering to a circumferential region of the discharge port on the outer periphery of the housing,
   wherein the CPU is configured to change at least one of a distance and a speed when the CPU causes the movable object to move in the second direction from the first position so as to open the discharge port at the second position of the movable object in accordance with the amount of the fluid detected by the fluid detector.

6. A method of discharging a fluid stored in a housing from a discharge port that is formed at part of an outer periphery of the housing, the method for causing a CPU to execute a program stored in a memory, the method comprising executing on the CPU the steps of:
   closing the discharge port by moving a movable object housed in the housing in a first direction to a first position of the movable object toward the discharge port as a first operation;
   opening the discharge port by moving the movable object in a second direction from the first position to a second position of the movable object as a second operation after the first operation;
   ejecting the fluid from the discharge port to an outside of the housing by moving the movable object in the first direction from the second position to a third position of the movable object toward the discharge port as a third operation after the second operation; and
   moving the movable object in the second direction from the third position while the fluid is ejected from the discharge port as a fourth operation after the third operation,
   wherein the CPU is configured to change a moving speed of the movable object from a first speed to a second speed when the CPU causes the movable object to move in the second direction from the third positon while the fluid is ejected from the discharge port, and the second speed is slower than the first speed.

7. The method of discharging the fluid according to claim 6,
   wherein when the CPU causes the movable object to move in the first direction from the second positon so as to eject the fluid in the third operation, the CPU causes the movable object to move to the first position so as to close the discharge port so that the first position is the same as the third position.

8. The method of discharging the fluid according to claim 6,
   wherein the CPU causes the movable object to move in the second direction from the third positon to a fourth position of the movable object while the fluid is ejected from the discharge port in the fourth operation, and a distance between the first position and the second position is equal to or less than a distance between the third position and the fourth position.

9. The method of discharging the fluid according to claim 6, wherein the CPU causes the movable object to move at a third speed in the first direction from the second positon to the third position of the movable object so as to eject the fluid in the third operation, after the CPU causes the movable object to move in the second direction from the third positon to a fourth position of the movable object while the fluid is ejected from the discharge port in the fourth operation, the CPU causes the movable object to move at a fourth speed in the first direction from the fourth position to the first position, and the fourth speed is slower than the third speed.

10. The method of discharging the fluid according to claim 6, further comprising:

detecting an amount of the fluid adhering to a circumferential region of the discharge port on the outer periphery of the housing, wherein the CPU is configured to change at least one of a distance and a speed when the CPU causes the movable object to move in the second direction from the first position so as to open the discharge port at the second position of the movable object in the second operation in accordance with the amount of the fluid detected by the detecting.

* * * * *